(12) United States Patent
Racanelli et al.

(10) Patent No.: US 6,995,068 B1
(45) Date of Patent: Feb. 7, 2006

(54) DOUBLE-IMPLANT HIGH PERFORMANCE VARACTOR AND METHOD FOR MANUFACTURING SAME

(75) Inventors: Marco Racanelli, Orange, CA (US); Chun Hu, Irvine, CA (US); Phil N. Sherman, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 283 days.

(21) Appl. No.: 09/590,462

(22) Filed: Jun. 9, 2000

(51) Int. Cl.
  *H01L 21/76* (2006.01)
(52) U.S. Cl. ............... 438/379; 438/373; 438/376; 257/592; 257/595; 257/596
(58) Field of Classification Search ............... 257/312, 257/480, 595–602, 558, 592; 438/379, 570, 438/373, 376
  See application file for complete search history.

(56) References Cited

U.S. PATENT DOCUMENTS

| | | | | |
|---|---|---|---|---|
| 3,581,164 | A | * | 5/1971 | Pfander et al. ............ 257/535 |
| 3,761,319 | A | * | 9/1973 | Shannon ............ 438/357 |
| 3,770,519 | A | * | 11/1973 | Wiedmann ............ 438/357 |
| 3,914,708 | A | | 10/1975 | Stover |
| 4,064,620 | A | | 12/1977 | Lee |
| 4,224,733 | A | | 9/1980 | Spadea |
| 4,381,952 | A | | 5/1983 | Rosen |
| 4,416,050 | A | | 11/1983 | Sarace |
| 4,442,591 | A | | 4/1984 | Haken |
| 4,727,046 | A | | 2/1988 | Tuntasood |
| 4,868,134 | A | * | 9/1989 | Kasahara ............ 438/379 |
| 4,876,211 | A | | 10/1989 | Kanber |
| 5,010,026 | A | * | 4/1991 | Gomi ............ 438/363 |
| 5,024,955 | A | * | 6/1991 | Kasahara ............ 148/DIG. 4 |
| 5,069,002 | A | | 12/1991 | Sandhu et al. |
| 5,225,034 | A | | 7/1993 | Yu et al. |
| 5,234,540 | A | | 8/1993 | Grant et al. |
| 5,240,522 | A | | 8/1993 | Tanaka et al. |
| 5,242,524 | A | | 9/1993 | Leach et al. |
| 5,314,843 | A | | 5/1994 | Yu et al. |
| 5,376,483 | A | | 12/1994 | Rolfson |
| 5,405,790 | A | | 4/1995 | Rahim |
| 5,407,526 | A | | 4/1995 | Danielson et al. |
| 5,413,941 | A | | 5/1995 | Koos et al. |
| 5,439,553 | A | | 8/1995 | Grant et al. |

(Continued)

FOREIGN PATENT DOCUMENTS

DE    3034287 A    *    4/1981

(Continued)

OTHER PUBLICATIONS

IBM Corporation (NN79013241), "Determination of Doping Profiles by Means of SIMS", IBM Technical Disclosure Bulleting, 1979, vol. 21, Issue No. 8, p. 3241-3242.*

(Continued)

*Primary Examiner*—Tom Thomas
*Assistant Examiner*—José R Diaz
(74) *Attorney, Agent, or Firm*—Farjami & Farjami LLP

(57) ABSTRACT

A varactor designed to enable voltage controlled oscillator (VCO) integration in wireless systems is the base-emitter junction of a specially optimized NPN device formed with a double base implant. A first, shallow implant optimizes capacitance, leakage current, and tuning range. A second, deeper base implant is used to improve the quality factor of the device by reducing the base resistance. The varactor includes a third terminal (collector), which isolates the emitter-base junction from the substrate, providing flexibility in circuit applications. A method for fabricating a high performance varactor having the above-described structure is also provided.

21 Claims, 10 Drawing Sheets

U.S. PATENT DOCUMENTS

| | | | |
|---|---|---|---|
| 5,557,140 A * | 9/1996 | Nguyen et al. | 257/596 |
| 5,576,126 A | 11/1996 | Rolfson | |
| 5,578,855 A | 11/1996 | Gaffur | |
| 5,627,402 A | 5/1997 | Takemura | 257/596 |
| 5,637,185 A | 6/1997 | Murarka et al. | |
| 5,648,281 A | 7/1997 | Williams | |
| 5,685,951 A | 11/1997 | Torek et al. | |
| 5,691,546 A * | 11/1997 | Morishita | 257/19 |
| 5,783,495 A | 7/1998 | Li et al. | |
| 5,854,117 A | 12/1998 | Huisman et al. | 438/379 |
| 5,880,516 A * | 3/1999 | Yamazaki | 257/558 |
| 5,965,912 A | 10/1999 | Stolfa | |
| 6,015,726 A | 1/2000 | Yoshida | |
| 6,103,456 A | 8/2000 | Többen et al. | |
| 2002/0014650 A1 * | 2/2002 | Kubo | 257/309 |

FOREIGN PATENT DOCUMENTS

| | | | |
|---|---|---|---|
| JP | 53-145578 A1 * | 12/1978 | |
| JP | 56026477 A * | 3/1981 | |
| JP | 56042381 A * | 4/1981 | |
| JP | 04092477 A * | 3/1992 | |
| JP | 04-177770 A1 * | 6/1992 | |
| JP | 04-287978 A1 * | 10/1992 | |
| JP | 04343479 A * | 11/1992 | |

OTHER PUBLICATIONS

Racanelli, M. et al. "BC35: a 0.35μm, 30 GHz, Production RF BiCMOS Technology", Bipolar/BiCMOS Circuits and Technology Meeting, Sep. 1999.

* cited by examiner ated for various implant structures. The deeper the implant, the broader the profile, which means that fewer of the implanted ions are located at their desired depth. On the other hand, shallower implants exhibit much steeper implant profiles. These phenomena are a well-known result of typical ion implantation methods. In a varactor, in order to get
DOUBLE-IMPLANT HIGH PERFORMANCE VARACTOR AND METHOD FOR MANUFACTURING SAME

FIELD OF INVENTION

This invention relates generally to a method for fabricating a varactor diode on a semiconductor substrate. More particularly, the present invention relates to a method for fabricating high quality factor (Q), high tuning range diodes having a double base implant.

BACKGROUND OF THE INVENTION

Varactor diodes are commonly used as tuning elements in oscillators, as multiplication elements in harmonic generators or multipliers, and as impedance control elements in analog and digital phase shifters at radio microwave or millimeter wave frequencies. Varactor diodes are semiconductor devices also known as variable-capacitance diodes or voltage variable capacitors. In varactor diodes, the capacitance is not constant, but rather varies with the voltage applied to the device. The larger the reverse voltage applied to the diode, the larger the space charge width within the diode and the smaller the capacitance. For example, as impedance control elements in variable phase shifters, the voltage is varied to change the capacitance of the diode and hence the impedance thereby effecting a phase shift change.

A conventional varactor diode incorporates an active semiconductor layer that is sandwiched between a pair of contact layers. The two contact layers are of high conductivity and are of opposite conductivity type from each other, such that one of the contact layers forms a P-N junction with the active layer. The thickness of the active layer, as well as the relative conductivity between the active layer and each of the contact layers, determines the operating characteristics of the varactor.

Varactor diodes are frequently fabricated by initially providing a silicon substrate having a resistivity that matches that of the desired active layer. The heavily doped contact layers are then epitaxially formed and conductor material is deposited on the contact layers. Alternatively, the diode can be formed by starting with a high conductivity substrate and then sequentially forming an epitaxial active layer and epitaxial contact layer.

A common practice utilizes the emitter-base junction of an NPN transistor as a varactor. This practice, however, typically creates a varactor having relatively high leakage current and relatively low capacitance sensitivity. The high base resistance of such a structure also may lead to a low value for Q, or quality factor, which is unfavorable for radio frequency (RF) applications.

Known varactor systems employ a single implant. This is because current double-implant processes do not provide a method for creating varactors having high capacitance density, high capacitance tuning range, low leakage current, and high Q values. The present invention achieves an advance in the art by providing a method and structure for a new varactor design that meets the above challenges.

The problems of the prior art single-implant varactor systems are apparent in the implant profiles readily generated for various implant structures. The deeper the implant, the broader the profile, which means that fewer of the implanted ions are located at their desired depth. On the other hand, shallower implants exhibit much steeper implant profiles. These phenomena are a well-known result of typical ion implantation methods. In a varactor, in order to get the maximum voltage sensitivity in the final device, a steep implant profile is desirable. Thus, to maximize voltage sensitivity, a shallow implant is most preferred. A shallow implant, however, exhibits other undesirable characteristics, namely, high leakage current. The leakage current is determined by the peak doping at the P-N junction. In order to achieve low leakage current, it is desirable to have a low doping concentration on the P-type side of the P-N junction. Together, these two variables—leakage current and voltage sensitivity—are optimized when a steep implant profile having a low peak (i.e., low peak doping concentration) is exhibited. Yet another problem is encountered, however, when the leakage current and voltage sensitivity are optimized in this way. Namely, a low peak doping concentration necessitates use of a limited dose of dopant material. Limited dose of dopant material results in higher series resistance for the device. Series resistance is characterized by the so-called quality factor (Q) of the capacitor. Ideally, a capacitor exhibits zero resistance, only capacitance. In reality, however, some amount of resistance is exhibited that degrades the properties of the capacitor. This relationship between reactance and resistance is represented by Q. As total series resistance approaches a value of zero (i.e., zero resistance, an "ideal" capacitor), Q approaches a value of infinity. Thus, by using a deep implant, low leakage current and low series resistance can be maintained because the implant profile has a low peak doping concentration and very little dopant material remains near the surface. Thus, a varactor formed using a single, deep implant typically will be characterized by high Q and low leakage current, but also an undesirably low voltage sensitivity (i.e., low tuning range). Alternatively, high tuning range may be maintained by utilizing a shallow implant that exhibits a steep implant profile, but high series resistance and/or high leakage current may be experienced. Thus, a varactor formed using a single, shallow implant typically will be characterized by high voltage sensitivity, but low Q and/or high leakage current.

SUMMARY OF THE INVENTION

A varactor made in accordance with the present invention utilizes the base-emitter junction of a specially optimized varactor formed with a double base implant. A first, shallow base implant optimizes capacitance, leakage current, and tuning range. A second, deeper base implant is used to improve Q by reducing the base resistance. The varactor preferably includes a third terminal (e.g., a collector terminal), which isolates the emitter-base junction from the substrate, providing flexibility in circuit applications.

Various aspects, features and advantages of the present invention will be better understood by studying the detailed description in conjunction with the drawings and the accompanying claims.

BRIEF DESCRIPTION OF THE DRAWINGS

A detailed description of various preferred embodiments of the invention will be made with reference to the accompanying drawings, wherein like numerals designate corresponding parts in the several Figures, and wherein.

DETAILED DESCRIPTION OF THE DRAWINGS

As those skilled in the art are aware, a variety of techniques currently exist for the design and manufacture of integrated circuit devices. For purposes of illustration only, and without limitation, the present invention will be described with particular reference to the below-described conventional bipolar complementary metal oxide silicon (BiCMOS) fabrication method. Although specific materials, conductivity types, ion concentrations, thicknesses, and other parameters are set forth herein, it should be understood that these are not meant to be limiting and serve only to illustrate various aspects of a preferred embodiment of the present invention.

FIGS. 1 through 9 generally illustrate the formation of a so-called isolation structure of a varactor device on a semiconductor substrate. The isolation structure preferably defines an implant region 81 (see FIG. 8) wherein a double-implant varactor device in accordance with the present invention may be formed.

Figure 1:
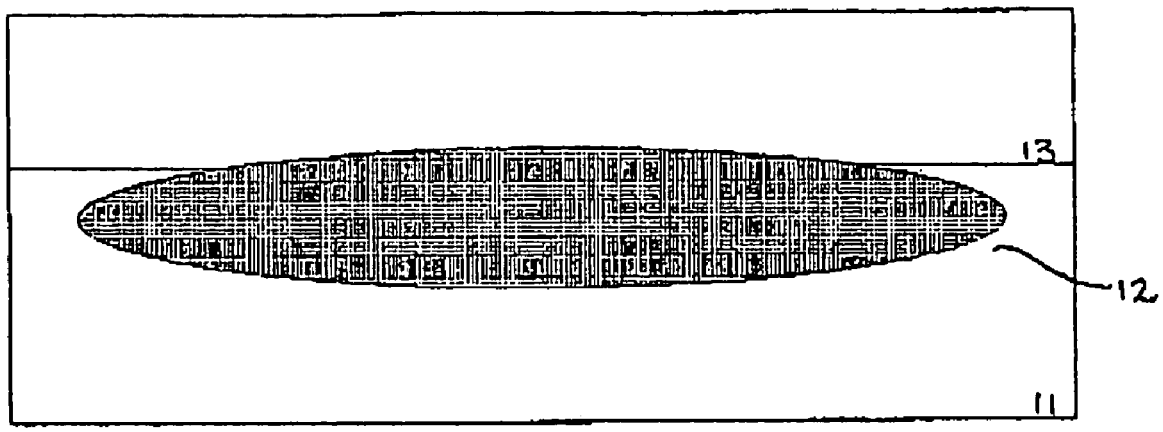
FIGS. 1 through 14 illustrate an exemplary process sequence for forming a varactor device on a semiconductor substrate in accordance with one embodiment of the present invention.
Figure 2:
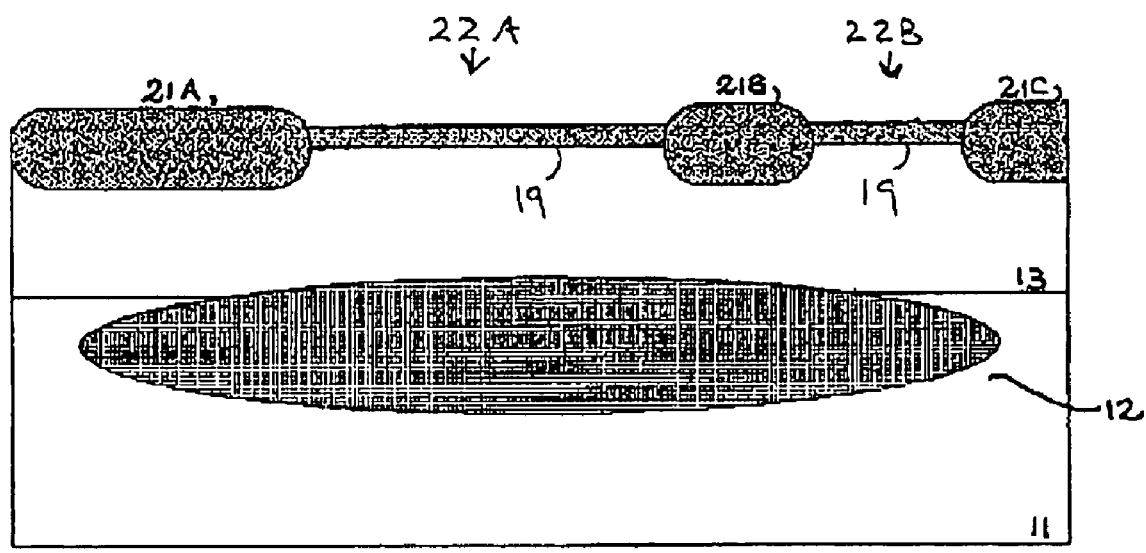

Referring first to FIG. 1, a semiconductor substrate 11 comprising a suitable semiconductor material is provided. In the illustrated embodiment, substrate 11 comprises single-crystal silicon of a P-type conductivity and has a resistivity on the order of about 6 to 8 ohm-centimeters. A screen oxide layer (not shown) is formed on substrate 11. The screen oxide layer is thermally grown and has a thickness on the order of about 200 to 300 angstroms. The screen oxide layer serves to protect the surface of substrate 11 from contamination during implantation of the buried layer.

An N+ buried layer 12 is formed in substrate 11 by implanting arsenic or another suitable N-type dopant material into the substrate. The N-type dopant material is implanted in the region where the varactor device will later be formed. In the illustrated embodiment, N+ buried layer 12 has a surface dopant concentration on the order of $10^{19}$ atoms per cubic centimeter (atoms/cm$^3$). Once N+ buried layer 12 has been formed, it is preferably annealed. The anneal process helps restore structural (i.e., crystal) damage to the substrate resulting from the ion implantation process and causes electrical activation of the dopant material. A typical anneal process in a tube furnace will occur at a temperature between about 1000° C. and about 1100° C.

Following the formation of N+ buried layer 12, the screen oxide layer (not shown) is removed to expose substrate 11, wherein substrate 11 includes N+ buried layer 12. The screen oxide layer may be removed by any suitable method known to those skilled in the art, for example, by wet etching with hydrofluoric acid. Once the screen oxide layer is removed, a semiconductor material such as an epitaxial layer 13 is formed on substrate 11 and comprises, for example, single crystal silicon. Epitaxial layer 13 may be formed by any suitable method known to those skilled in the art, including but not limited to, for example, chemical vapor deposition (CVD). Epitaxial layer 13 is lightly doped with a P-type material, such as phosphorus, resulting in a dopant concentration on the order of $10^{15}$ to $10^{16}$ atoms/cm$^3$. The thickness of epitaxial layer 13 may vary depending upon the design of the device, but preferably ranges from about 0.6 to about 1.6 micrometers ($\mu$m).

Next, a well oxide layer (not shown) is formed on epitaxial layer 13. The well oxide layer preferably has a thickness on the order of about 100 to 500 Angstroms and may be thermally grown or deposited. An "active" nitride layer (not shown) is then deposited on the well oxide layer and preferably has a thickness on the order of about 1000 to 2000 Angstroms. Using standard photoresist techniques, portions of the well nitride layer are etched to expose portions of the well oxide layer surface. These exposed regions of the well oxide layer are then thermally oxidized to achieve a total oxide thickness on the order of about 3000 to 6000 Angstroms, forming field oxide regions 21A, 21B, and 21C, shown in FIG. 2. The remaining portions of the well nitride layer are removed using standard etching techniques or other methods known in the art, revealing well oxide layer 19 at active regions 22A and 22B. A technique that selectively removes the well nitride layer without significantly etching the well oxide layer disposed therebeneath is preferably employed. Although the number of field oxide regions and active regions may vary according to the desired semiconductor device structure, preferably at least one active region 22A is disposed over N+ buried layer 12.

Figure 3:
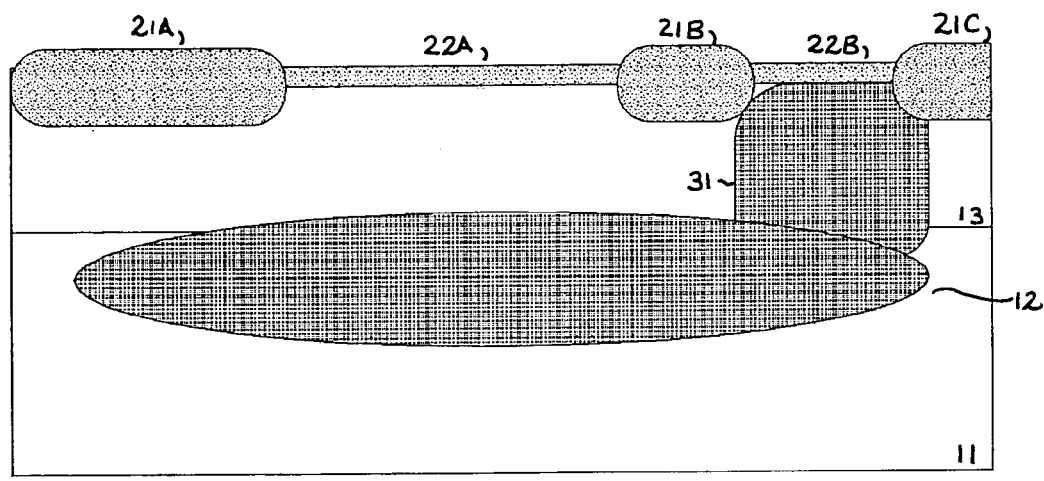

Referring now to FIG. 3, using standard photoresist masking techniques, phosphorus or another suitable N-type dopant is selectively implanted into epitaxial layer 13 at active region 22B to form collector sinker 31. After implanting the N-type dopant, sinker 31 is annealed. Following the anneal of collector sinker 31, the well oxide layer 19 is removed from the surface of epitaxial layer 13 in which the collector sinker has been formed.

Figure 4:
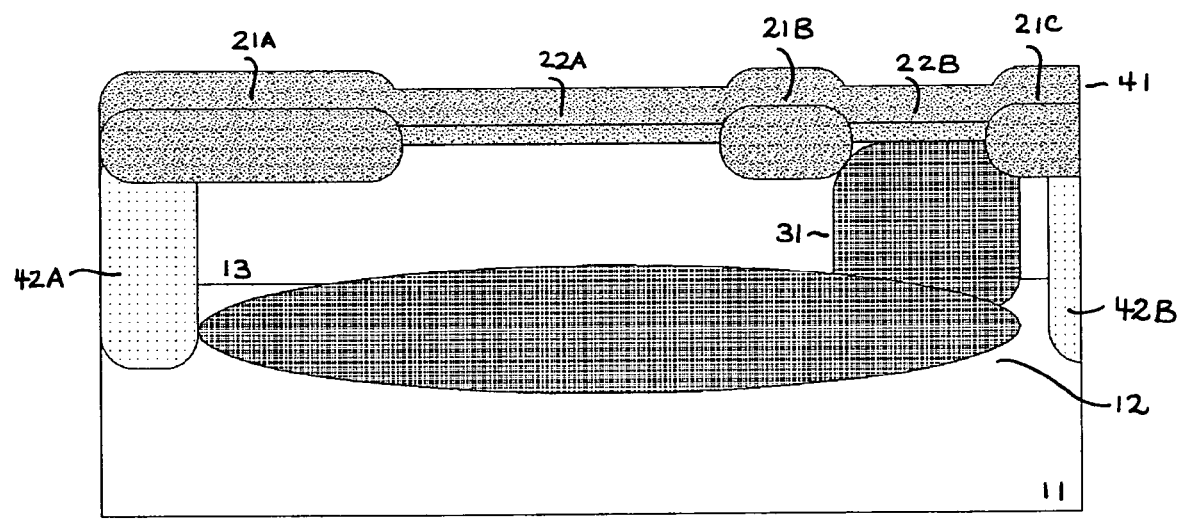
Figure 5:
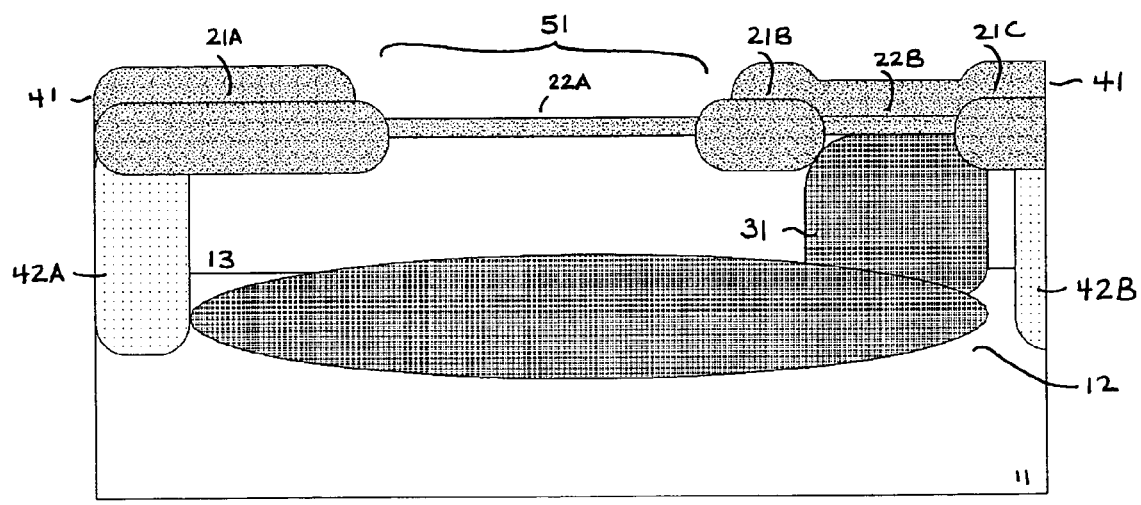
Figure 6:
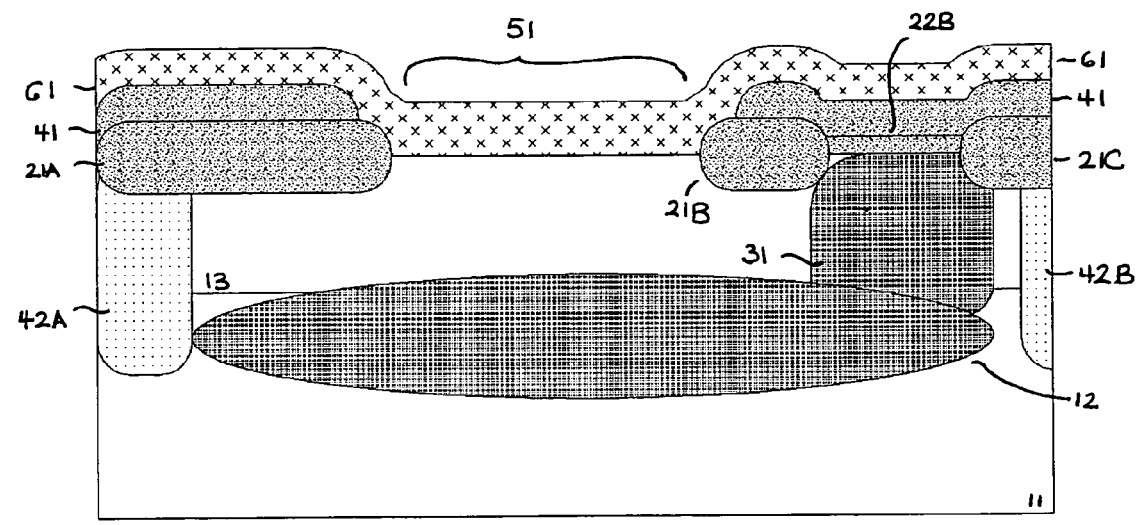

In FIG. 4, a spacer oxide layer 41 is deposited on the surface of epitaxial layer 13 and field oxide regions 21A, 21B, and 21C. Additionally, P-type isolation regions 42A and 42B are formed using conventional ion implantation techniques. Isolation regions 42A and 42B serve to electrically isolate the varactor device from other devices that may be formed on the same substrate. Using standard photoresist masking techniques, a portion of spacer oxide layer 41 is selectively removed via a dry and/or wet etch process or other suitable method to expose an implant region 51 (see FIG. 5). Implant region 51 represents the region of the semiconductor device where the varactor device of the present invention will be formed. In FIG. 6, after removal of the photoresist mask (not shown), a base polysilicon layer 61 is deposited using one or more methods well known in the art. Preferably, the thickness of base polysilicon layer 61 is on the order of about 1800 to 2500 Angstroms. A P-type dopant such as boron or boron difluoride is then implanted into base polysilicon layer 61 to achieve a peak dopant concentration that preferably is on the order of about $10^{18}$ to $10^{20}$ atoms/cm$^3$.

Figure 7:
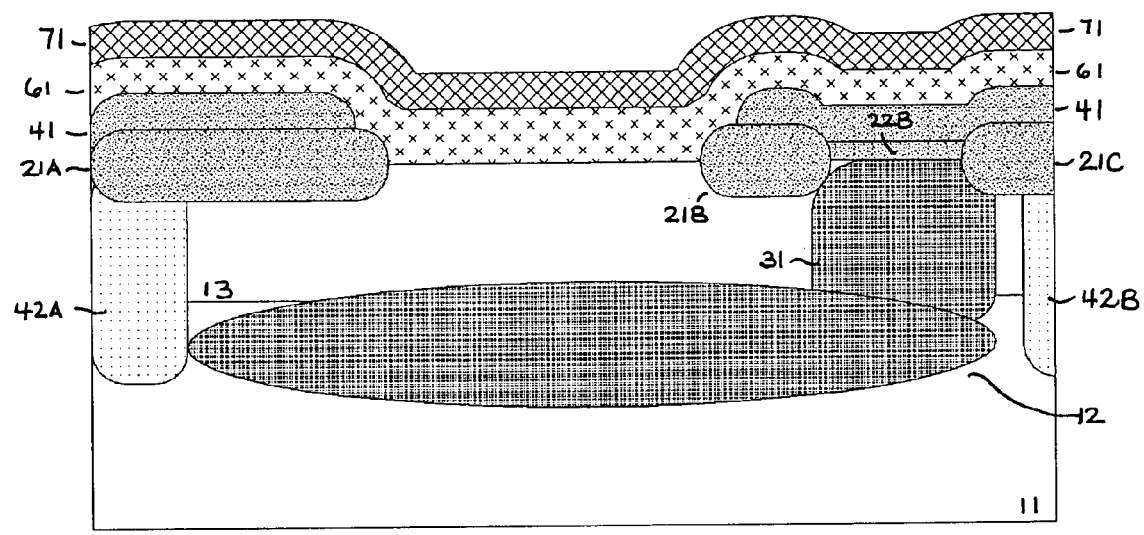
Figure 8:
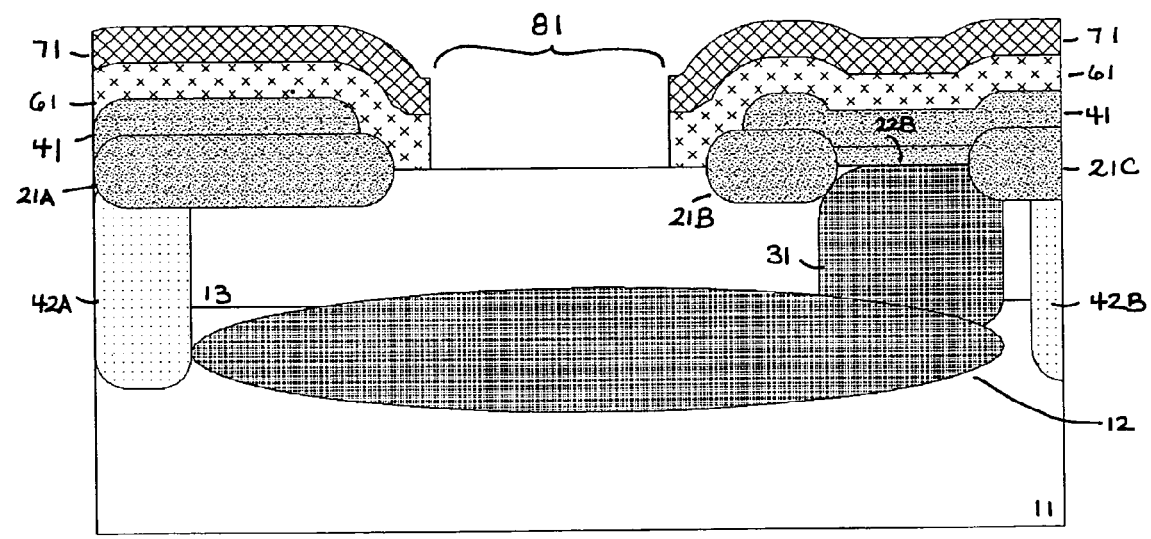
Figure 9:
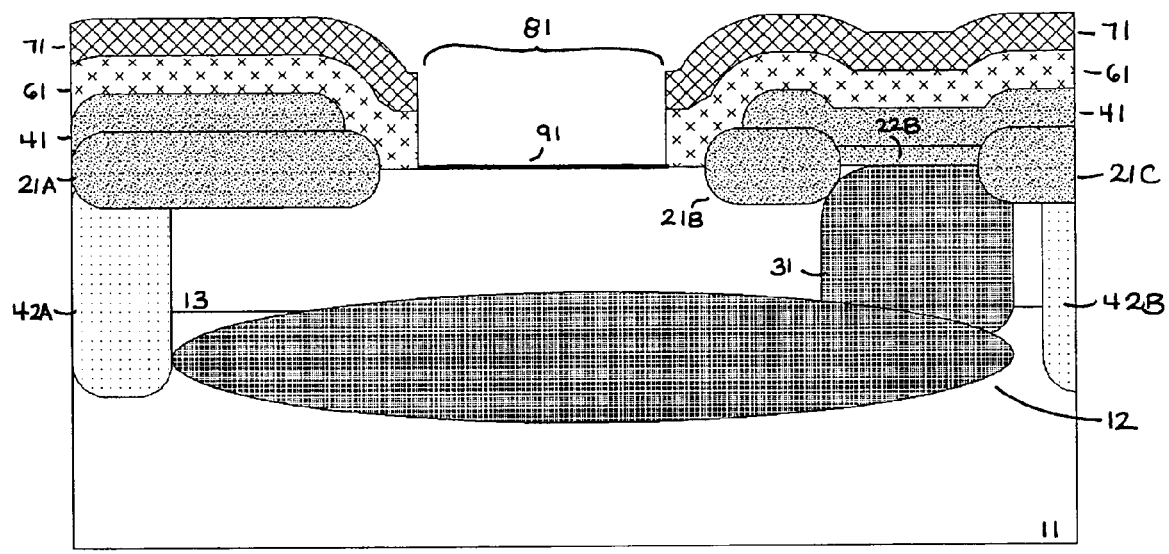

Referring now to FIG. 7, after formation of base polysilicon layer 61, a base oxide layer 71 is deposited on the surface of polysilicon layer 61. Base oxide layer 71 preferably has a thickness on the order of about 1800 to 2500 Angstroms. In FIG. 8, using standard photoresist masking techniques, an emitter window 81 is formed via any suitable method known in the art, including but not limited to, for example, wet or dry etching. Emitter window 81 will later serve to define an emitter region. Following formation of emitter window 81, a screen oxide layer 91 is formed in the region of emitter window 81 (FIG. 9). Screen oxide layer 91 serves to protect the device from contamination during the ion implantation process employed in the formation of the varactor of the present invention.

Figure 10:
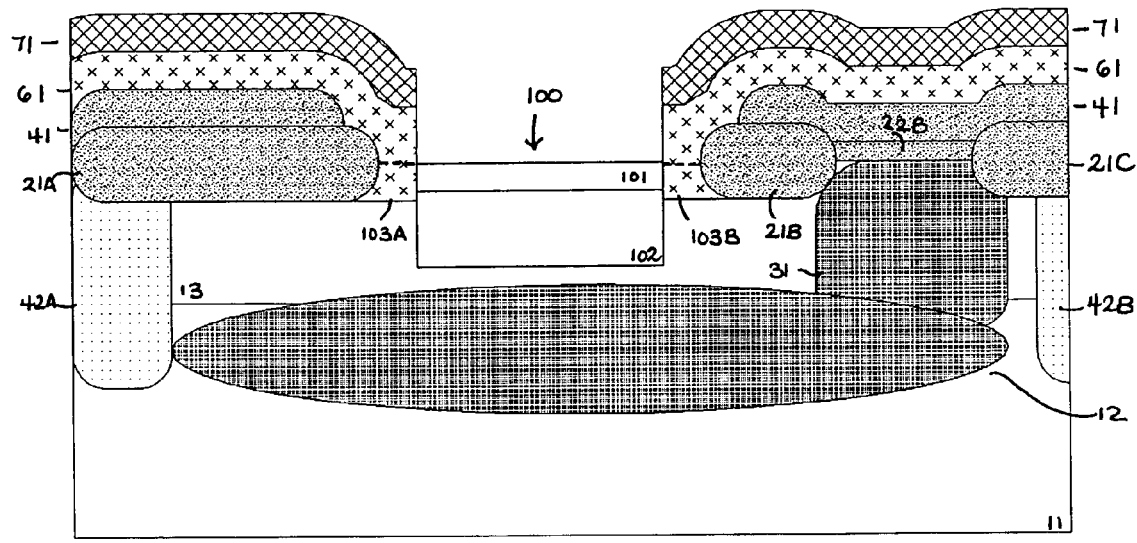
Figure 11:
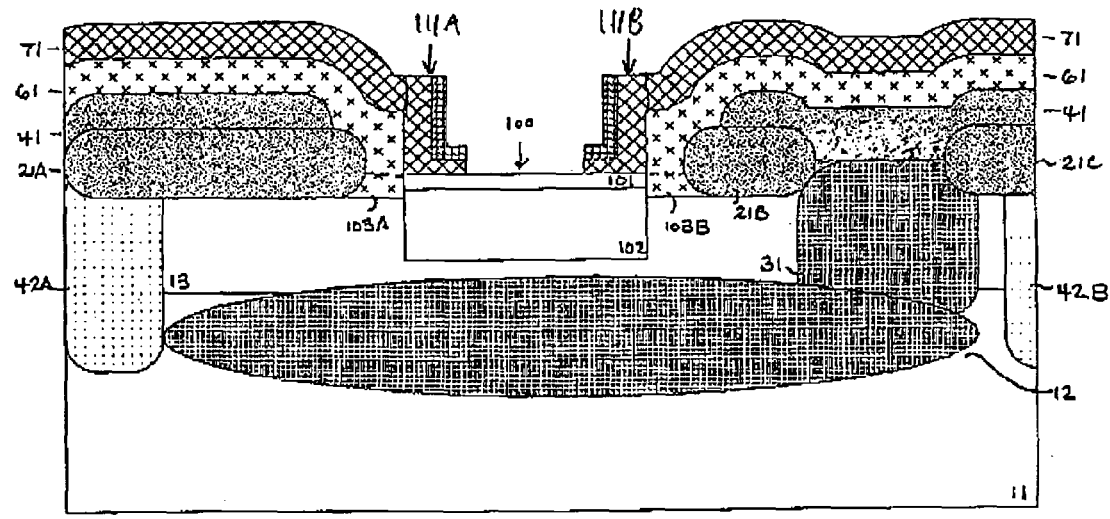

Now referring specifically to FIG. 10, a double-implant varactor is formed in accordance with a preferred embodiment of the present invention. The varactor of the present invention as illustrated comprises the base-emitter junction of a specially optimized NPN device formed with a double base implant. First, a shallow base implant 101 is formed using standard ion implantation techniques. Shallow base implant 101 comprises P-type ions, such as boron, for example, implanted into epitaxial layer 13. The doping profile of shallow base implant 101 is optimized for capacitance, leakage current, and tuning range in accordance with a further aspect of the invention described hereinbelow. For example, in a preferred embodiment, leakage current may be maintained below 20 nA at 2.5 V for a 4 pF capacitor (0 V capacitance). In accordance with a preferred embodiment of the present invention, varactors having significant tuning headroom with a capacitance sensitivity of approximately 17%/V and a three-sigma process variation of only approximately 9% may be achieved.

A deep base implant 102 is then formed using standard ion implantation techniques. Deep base implant 102 comprises P-type ions, such as boron, for example, implanted into epitaxial layer 13 such that deep base implant 102 is disposed below shallow base implant 101. The doping profile of deep base implant 102 is optimized in accordance with a further aspect of the invention described herein to improve Q by reducing the base resistance. For example, in accordance with a preferred embodiment of the present invention, Q of better than 40 may be achieved at 2 GHz.

Following formation of the double-implant varactor 100 comprising shallow base implant 101 and deep base implant 102, an anneal step preferably is performed. During anneal, base polysilicon layer 61 may exhibit some degree of outdiffusion, that is, diffusion into epitaxial layer 13, wherein outdiffusion regions 103A and 103B may be formed. These regions may enhance electrical contact to varactor 100.

Following formation of varactor 100 and subsequent anneal, further aspects of the desired semiconductor device are completed in accordance with techniques well known in the art. Various aspects of a preferred process of completing the semiconductor device, including the formation of the desired device metallization structure, are illustrated in FIGS. 11 through 14. For example, in accordance with one embodiment of the invention, nitride spacers 111A, 111B (FIG. 11) are formed on varactor 100 by forming a conformal oxide nitride oxide stack layer (not shown) over the surface of varactor 100, and then etching away the unwanted portions of the conformal oxide nitride oxide layer using standard techniques. Nitride spacers 111A, 111B are not limited to being nitride, but may be any suitable dielectric material (e.g., oxide, oxynitride).

Figure 12:
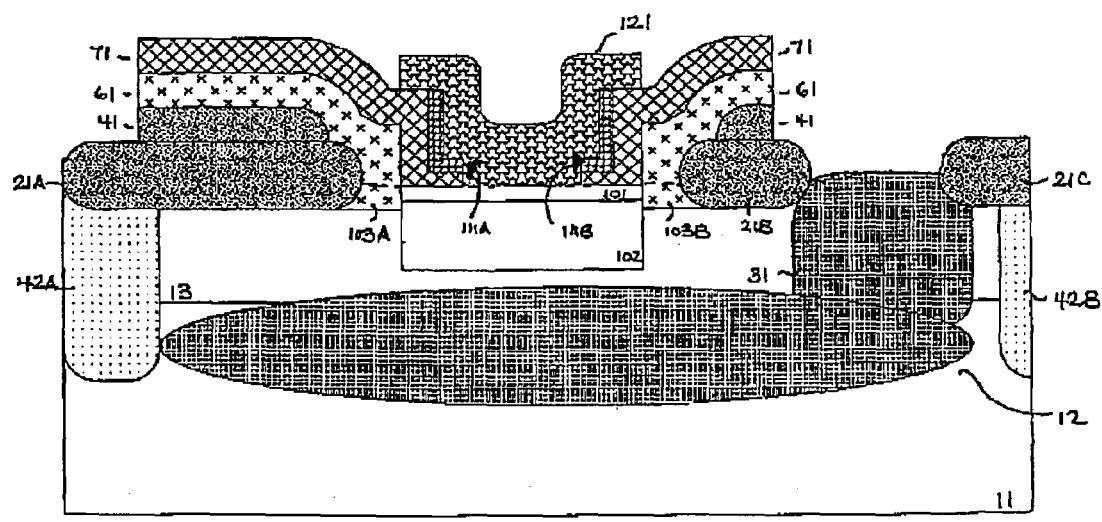

Following formation of nitride spacers 111A, 111B, emitter electrode 121 is formed through a series of standard process steps. First, a layer of polysilicon material (not shown) is deposited on the surface of the semiconductor device at a desired thickness, for example, on the order of approximately 2000 Angstroms. Then, a screen oxide layer (not shown) having a thickness on the order of, for example, about 100 to 200 Angstroms, is deposited or thermally grown on the polysilicon layer. Arsenic or similar N-type dopant is implanted into the polysilicon layer through the screen oxide layer to achieve a dopant concentration on the order of about $10^{18}$ to $10^{20}$ atoms/cm$^3$. The doped polysilicon layer is then patterned and etched to form emitter electrode 121 as shown in FIG. 12. A rapid thermal anneal process preferably completes formation of emitter electrode 121.

Figure 13:
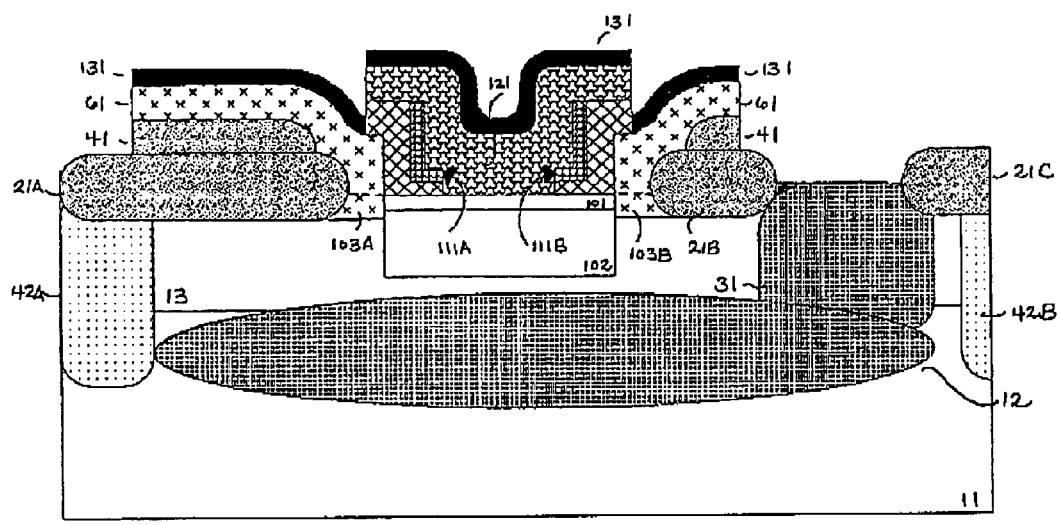
Figure 14:
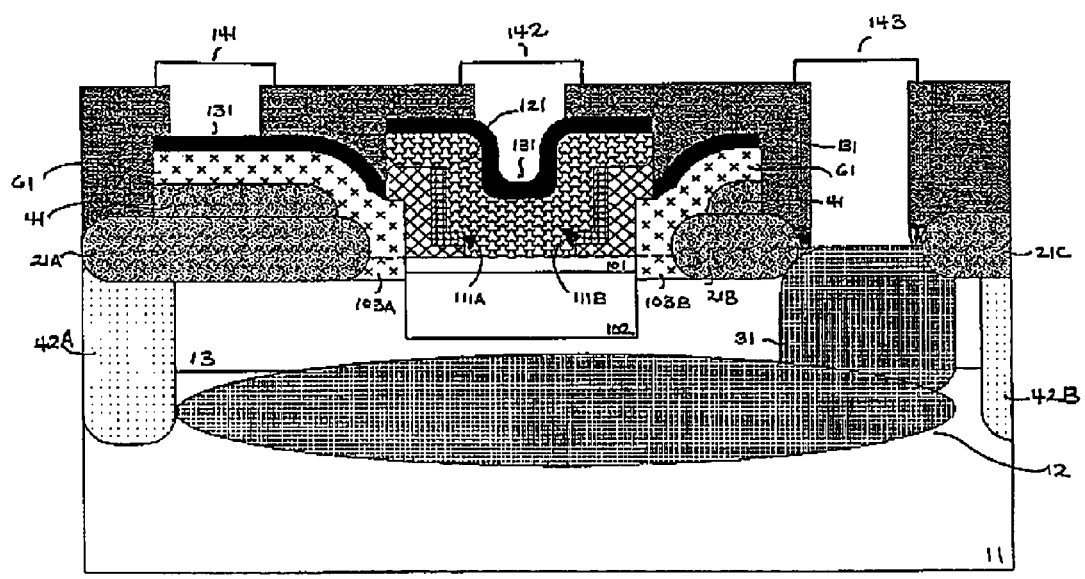

Emitter contact metallization commences with the formation of a suitable ohmic contact material, for example, titanium silicide, to form a contact layer 131 on the exposed electrodes of varactor 100 (FIG. 13). Base terminal 141, emitter terminal 142, and collector terminal 143 contacts are formed using standard metallization processes (FIG. 14). Base terminal 141 and emitter terminal 142 are contacted using any convenient technique to complete formation of the varactor diode. In a preferred embodiment, collector terminal 143 isolates the emitter-base junction from the substrate, providing flexibility in circuit applications.

Figure 15:
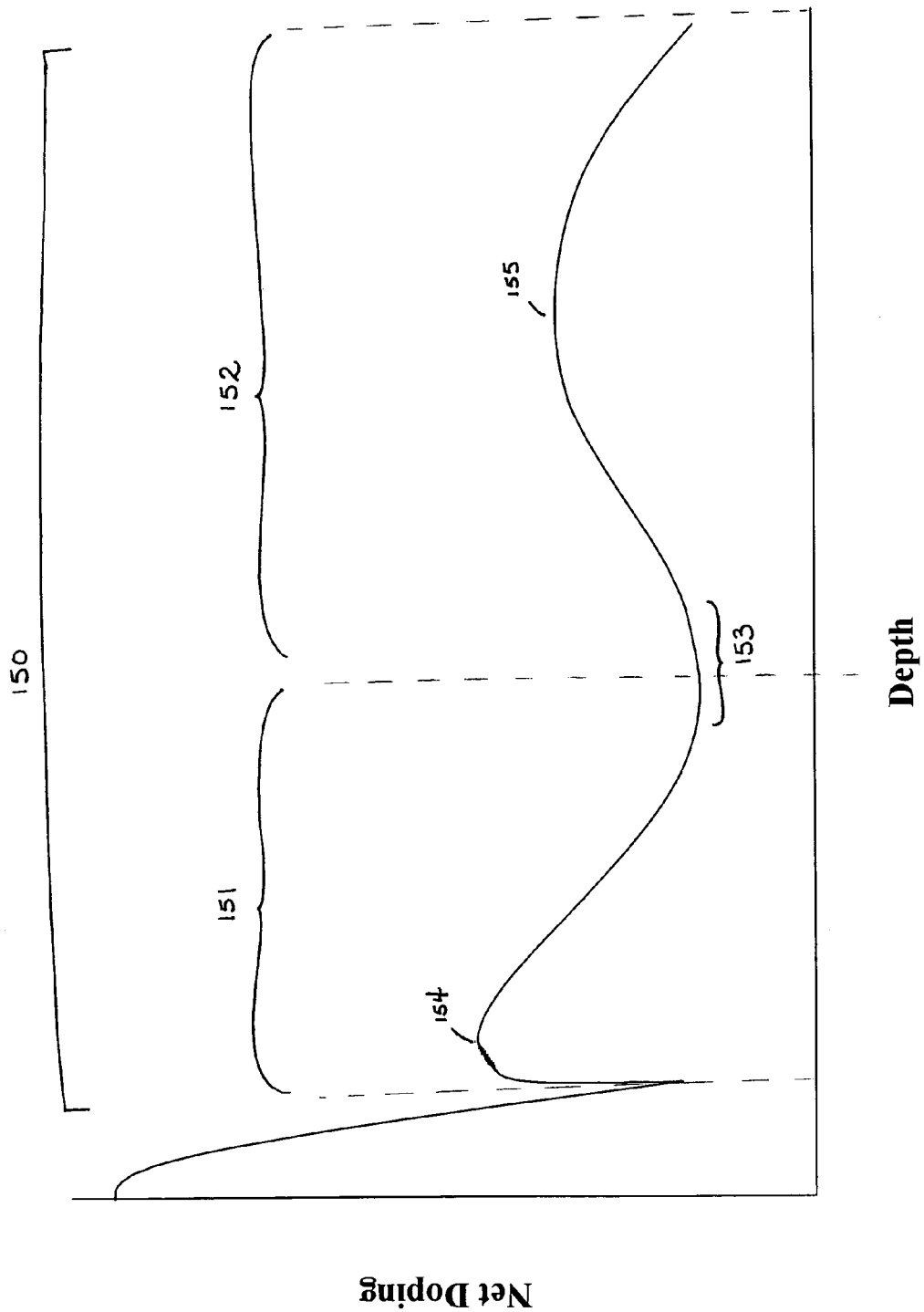
FIG. 15 illustrates empirically a simulated as-implanted dopant concentration profile for a varactor formed in accordance with one embodiment of the present invention.

FIG. 15 illustrates empirically a simulated as-implanted dopant concentration profile 150 for a varactor formed in accordance with one embodiment of the present invention. In FIG. 15, shallow concentration profile 151 illustrates the relationship between net dopant concentration and implant depth for the first, shallow base implant of a preferred varactor. Deep concentration profile 152 illustrated the relationship between net dopant concentration and implant depth for the second, deep base implant of a preferred varactor.

In one aspect of the present invention, shallow concentration profile 151 is optimized to achieve high tuning range (i.e., high voltage sensitivity) and low leakage current by minimizing peak dopant concentration 154 and maximizing the slope of the profile. Shallow concentration profile 151 is thus achieved by simulating a low-dopant, shallow base implant. As implant depth increases, the breadth of shallow concentration profile 151 increases, and thus profile slope decreases. It is therefore preferable to minimize the depth of the first, shallow base implant.

Figure 16:
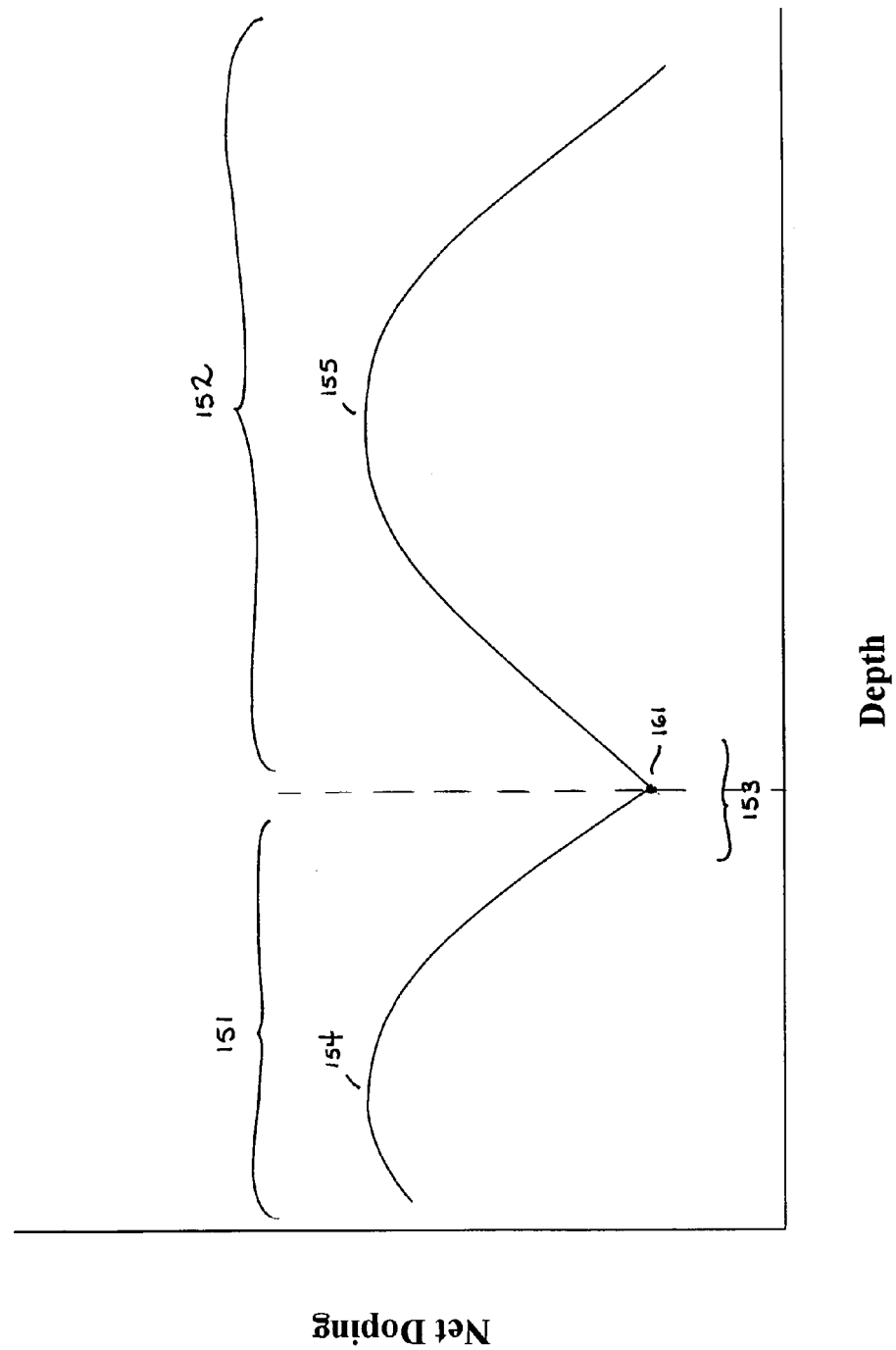
FIG. 16 illustrates another aspect of the simulated as-implanted dopant concentration profile for a varactor formed in accordance with one embodiment of the present invention.

In another aspect of the present invention, the maximum extent of the depletion region during varactor operation is identified at junction 161 (FIG. 16). Once junction 161 is identified and characterized, deep concentration profile 152 may be optimized for Q (i.e., designed to achieve low base resistance) by optimizing peak dopant concentration 155 and depth 162 without significantly changing doping concentration regions more shallow than junction 161.

Figure 17:
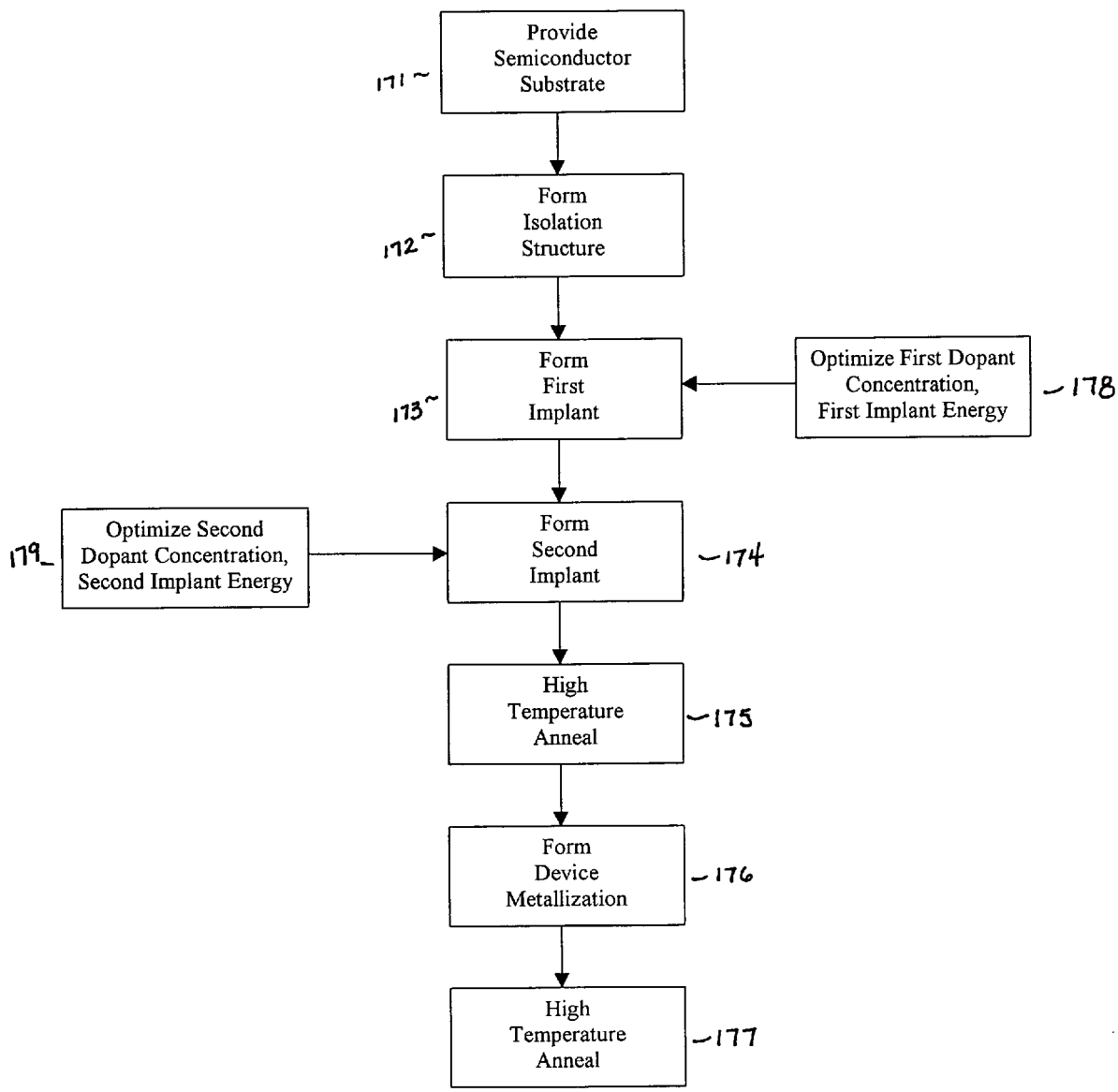
FIG. 17 is a flow diagram depicting a method for forming a varactor device on a semiconductor substrate in accordance with one embodiment of the present invention.

FIG. 17 is a flow diagram depicting a method for forming a varactor device on a semiconductor substrate in accordance with one embodiment of the present invention, as described in detail above. Step 171 comprises providing a semiconductor substrate, such as substrate 11 (see FIG. 1) of a suitable semiconductor material. Step 172 is illustrated in FIGS. 1 through 9, as described in detail above. Steps 173 and 174 encompass the formation of the double-implant varactor, as illustrated in FIG. 10 and its accompanying discussion. Device metallization is formed in Step 176, as illustrated in FIGS. 11 through 14 and their accompanying discussions. Preferred high temperature anneal Steps 175 and 177 follow formation of the double-implant varactor (Steps 173, 174) and the device metallization (Step 176), respectively. In a preferred aspect of the present invention, Steps 178 and 179 comprise optimizing the dopant concentrations and implant energies of the first and second implants of the varactor device in accordance with the optimization methods described herein and illustrated in FIGS. 15 and 16.

Using the optimization methods described herein, it is possible to simultaneously achieve low leakage current, high tuning range, and low resistance in a double-implant varactor system. It is possible, however, to optimize less than these three parameters in a double-implant varactor system by keeping one parameter constant and employing the optimization methods described herein to improve the values of the other parameters. For example, one may choose to keep the resistance value constant and optimize only leakage current and tuning range based on this value. In this way, parameters that are thought to be more significant in a particular application may be optimized beyond the values possible in an all-parameter optimization sequence by sacrificing optimum values for one or more other parameters.

In accordance with a further aspect of the present invention, optimization of deep base implant 102 in relation to shallow base implant 101 is performed prior to actual implantation to determine the most desirable parameters for the varactor. The as-implanted dopant concentration profile or ion implantation model for each of the two base implants may be determined by any convenient technique including, for example, capacitance-voltage techniques such as measuring the reverse-bias capacitance of a P-N junction or a Schottky barrier diode as a function of the applied voltage. A more elaborate and preferred method is the secondary-ion-mass spectroscopy (SIMS) technique, which measures the total impurity profile. In the SIMS technique, an ion beam sputters material off the surface of a semiconductor, and the ion component is detected and mass-analyzed. Although it has the disadvantage of being a destructive testing technique, the SIMS technique has high sensitivity to many elements such as boron and arsenic, and it is an ideal tool for providing the precision needed for profile measurements in high-concentration or shallow-junction diffusions. Another method of obtaining ion implantation models is by using the Monte Carlo method. In a Monte Carlo simulation, the ions are followed on their path through the material as they undergo binary collisions with the target atoms. Evaluating the end points of the ion trajectories allows the as-implanted dopant profile to be determined. Once an optimal as-implanted dopant profile is determined for a particular device, ion implantation process parameters may be set to achieve this optimum structure. Process parameters include ion implantation energy and ion concentration.

It is important to recognize that although the various layers within the semiconductor body have been identified as being of a particular conductivity type, an equivalent device would result if the conductivity type of each layer were reversed.

It will be obvious to those skilled in the art that a semiconductor device according to the present invention can be implemented with various semiconductor technologies and different combinations of known process steps, and that the preferred embodiments and aspects thereof illustrated here are merely exemplary. For example, the semiconductor materials, dopant species, and/or concentration of dopants and their concentration profiles can be chosen depending upon the desired properties of the completed device. These and other variations may be made by those skilled in the art to adapt the invention to a given situation without departing from its essential teachings.

What is claimed is:

1. A method of forming a varactor device on a semiconductor substrate, comprising the steps of:
    forming a buried layer in said semiconductor substrate, said semiconductor substrate having a first conductivity type and said buried layer having a second conductivity type;
    providing an epitaxial layer situated in said semiconductor substrate, said epitaxial layer having said first conductivity type, wherein said epitaxial layer is situated over said buried layer;
    providing an isolation structure on said semiconductor substrate, said isolation structure defining an implant region, said implant region being situated over said epitaxial layer;
    selecting a first peak dopant concentration and a first implant energy such that at least one of capacitance, leakage current, and tuning range of the varactor device is optimized;
    forming a first implant in said epitaxial layer using said first implant energy, said first implant having said first peak dopant concentration and said first conductivity type, wherein said first implant extends into said epitaxial layer a first distance, and wherein said first implant is situated over said buried layer;
    forming a second implant in said epitaxial layer using a second implant energy, said second implant having a second peak dopant concentration and said first conductivity type, wherein said second implant extends into said epitaxial layer a second distance, wherein said second distance is greater than said first distance, wherein said second implant is situated over said buried layer,
    and wherein said second peak dopant concentration has a depth that is greater than a depth of said first peak dopant concentration.

2. A method in accordance with claim 1, further comprising the step of annealing the device following the steps of forming said first implant and said second implant.

3. A method in accordance with claim 1, wherein said selecting step comprises determining an as-implanted dopant concentration profile for said first implant.

4. A method in accordance with claim 3, wherein said step of determining an as-implanted dopant concentration profile is performed using secondary ion mass spectroscopy.

5. A method in accordance with claim 1, further comprising the step of selecting said second peak dopant concentration and said second implant energy such that the base resistance of the varactor device is minimized.

6. A method in accordance with claim 5, wherein said selecting step comprises determining an as-implanted dopant concentration profile for said second implant.

7. A method in accordance with claim 6, wherein said step of determining an as-implanted dopant concentration profile is performed using secondary ion mass spectroscopy.

8. A method in accordance with claim 1, further comprising the step of forming a contact layer of said second conductivity type overlying said first implant.

9. A method in accordance with claim 1 wherein said step of providing an isolation structure comprises providing an isolation structure including a CMOS well.

10. A method of forming a varactor device on a semiconductor substrate, comprising the steps of:
    forming a buried layer in said semiconductor substrate, said semiconductor substrate having a first conductivity type and said buried layer having a second conductivity type;
    providing an epitaxial layer situated in said semiconductor substrate, said epitaxial layer having said first conductivity type, wherein said epitaxial layer is situated over said buried layer;
    providing an isolation structure on said semiconductor substrate, said isolation structure defining an implant region, said implant region being situated over said epitaxial layer;
    forming a first implant in said epitaxial layer using a first implant energy, said first implant having a first peak dopant concentration and said first conductivity type, wherein said first implant extends into said epitaxial layer a first distance, and wherein said first implant is situated over said buried layer;

forming a second implant in said implant region of said isolation structure using a second implant energy, said second implant having a second peak dopant concentration and said first conductivity type, wherein said second implant extends into said epitaxial layer a second distance, wherein said second implant is situated over said buried layer, wherein said second distance is greater than said first distance, wherein said first peak dopant concentration and said first implant energy are selected such that at least one of capacitance, leakage current, and tuning range of the varactor device are optimized, and wherein said second peak dopant concentration and said second implant energy are selected with relation to said first peak dopant concentration and said first implant energy such that the base resistance of the varactor device is minimized, and wherein said second peak dopant concentration has a depth that is greater than a depth of said first peak dopant concentration.

11. A method in accordance with claim 10 further comprising the step of forming a contact layer of said second conductivity type overlying said first implant.

12. A method in accordance with claim 10 wherein said step of providing an isolation structure comprises providing an isolation structure including a CMOS well.

13. A method of forming a varactor device on a semiconductor substrate, comprising steps of:

forming a buried layer in said semiconductor substrate, said semiconductor substrate having a first conductivity type and said buried layer having a second conductivity type;

providing an epitaxial layer situated in said semiconductor substrate, said epitaxial layer having said first conductivity type, wherein said epitaxial layer is situated over said buried layer;

selecting a first peak dopant concentration and a first implant energy such that at least one of capacitance, leakage current, and tuning range of the varactor device is optimized;

forming a first implant in said epitaxial layer using said first implant energy, said first implant having said first peak dopant concentration and said first conductivity type, wherein said first implant extends into said epitaxial layer a first distance, and wherein said first implant is situated over said buried layer;

forming a second implant in said epitaxial layer using a second implant energy, said second implant having a second peak dopant concentration and said first conductivity type, wherein said second implant extends into said epitaxial layer a second distance, wherein said second distance is greater than said first distance, wherein said second implant is situated over said buried layer, and wherein said second peak dopant concentration has a depth that is greater than a depth of said first peak dopant concentration.

14. A method in accordance with claim 13, further comprising the step of forming a contact layer of said second conductivity type overlying said first implant.

15. A method in accordance with claim 13, further comprising the step of annealing the device following the steps of forming said first implant and said second implant.

16. A method in accordance with claim 13, wherein said selecting step comprises determining an as-implanted dopant concentration profile for said first implant.

17. A method in accordance with claim 16, wherein said step of determining an as-implanted dopant concentration profile is performed using secondary ion mass spectroscopy.

18. A method in accordance with claim 13, further comprising the step of selecting said second peak dopant concentration and said second implant energy such that the base resistance of the varactor device is minimized.

19. A method in accordance with claim 18, wherein said selecting step comprises determining an as-implanted dopant concentration profile for said second implant.

20. A method of forming a varactor device on a semiconductor substrate, comprising the steps of:

forming a buried layer in said semiconductor substrate, said semiconductor substrate having a first conductivity type and said buried layer having a second conductivity type;

providing an epitaxial layer situated in said semiconductor substrate, said epitaxial layer having said first conductivity type;

forming a first implant in said epitaxial layer using a first implant energy, said first implant having a first peak dopant concentration and said first conductivity type, wherein said first implant extends into said epitaxial layer a first distance, and wherein said first implant is situated over said buried layer;

forming a second implant in said epitaxial layer using a second implant energy, said second implant having a second peak dopant concentration and said first conductivity type, wherein said second implant is situated over said buried layer, wherein said second distance is greater than said first distance, wherein said first peak dopant concentration and said first implant energy are selected such that at least one of capacitance, leakage current, and tuning range of the varactor device are optimized, wherein said second peak dopant concentration and said second implant energy are selected with relation to said first peak dopant concentration and said first implant energy such that the base resistance of the varactor device is minimized, and wherein said second peak dopant concentration has a depth that is greater than a depth of said first peak dopant concentration.

21. A method in accordance with claim 20 further comprising the step of forming a contact layer of said first conductivity type overlying said first implant.

* * * * *